United States Patent
Webb, III et al.

(10) Patent No.: US 9,319,054 B2
(45) Date of Patent: Apr. 19, 2016

(54) SYSTEMS AND METHODS UTILIZING RANDOMIZED CLOCK RATES TO REDUCE SYSTEMATIC TIME-STAMP GRANULARITY ERRORS IN NETWORK PACKET COMMUNICATIONS

(75) Inventors: Charles A. Webb, III, Austin, TX (US); Kishan Shenoi, Saratoga, CA (US)

(73) Assignee: Anue Systems, Inc., Austin, TX (US)

( * ) Notice: Subject to any disclaimer, the term of this patent is extended or adjusted under 35 U.S.C. 154(b) by 705 days.

(21) Appl. No.: 13/442,262

(22) Filed: Apr. 9, 2012

(65) Prior Publication Data

US 2013/0077642 A1 Mar. 28, 2013

Related U.S. Application Data

(60) Provisional application No. 61/539,806, filed on Sep. 27, 2011.

(51) Int. Cl.
   *H03L 7/197* (2006.01)
   *H04J 3/06* (2006.01)

(52) U.S. Cl.
   CPC ............. *H03L 7/1974* (2013.01); *H04J 3/0697* (2013.01); *H04J 3/0667* (2013.01)

(58) Field of Classification Search
   None
   See application file for complete search history.

(56) References Cited

U.S. PATENT DOCUMENTS

| | | |
|---|---|---|
| 5,638,379 A | 6/1997 | Narasimha et al. |
| 5,828,670 A | 10/1998 | Narasimha et al. |
| 6,167,048 A | 12/2000 | Law et al. |
| 6,236,623 B1 | 5/2001 | Read et al. |
| 6,871,312 B2 | 3/2005 | Hatley |
| 7,035,246 B2 | 4/2006 | Taylor |
| 7,356,047 B1 | 4/2008 | Mahalawat et al. |
| 7,551,647 B2 | 6/2009 | Fellman et al. |
| 7,606,546 B1* | 10/2009 | Liu et al. ................. 375/346 |
| 2003/0086515 A1* | 5/2003 | Trans et al. .............. 375/346 |
| 2003/0117899 A1* | 6/2003 | Eidson ...................... 368/46 |
| 2004/0037311 A1* | 2/2004 | Willes et al. ............. 370/465 |
| 2004/0073718 A1 | 4/2004 | Johannessen et al. |

(Continued)

OTHER PUBLICATIONS

International Search Report, PCT/US2012/055300, Dec. 10, 2012, 2 pgs.

(Continued)

*Primary Examiner* — Chirag Shah
*Assistant Examiner* — Srinivasa Reddivalam
(74) *Attorney, Agent, or Firm* — Egan, Peterman, Enders & Huston LLP.

(57) ABSTRACT

Systems and methods are disclosed for utilizing slave (receive) time-stamp clock rates that are different from master (sender) time-stamp clock rates to randomize and thereby reduce systematic time-stamp granularity errors in the communication of network packets. The slave (receive) time-stamp clock rate for some embodiments is set to be a fixed value that has a relationship with the master (sender) time-stamp clock rate such that the ratio of the slave (receive) clock rate to the master (sender) clock rate is a rational number. Other embodiments use a time-varying frequency for the slave (receive) time-stamp clock rate to randomize the slave (receive) time-stamp clock with respect to the master (sender) time-stamp clock. Additional time-stamps can also be generated using a slave (receive) time-stamp clock having a rate set to equal the rate of the master (sender) time-stamp clock signal. Further spread spectrum and/or delta-sigma modulation techniques can be applied to effectively randomize the slave (receive) time-stamp clock.

22 Claims, 6 Drawing Sheets

(56) References Cited

U.S. PATENT DOCUMENTS

| | | | |
|---|---|---|---|
| 2004/0076221 A1 | 4/2004 | Refaeli et al. | |
| 2007/0217559 A1* | 9/2007 | Stott et al. | 375/355 |
| 2007/0260906 A1* | 11/2007 | Corredoura | 713/400 |
| 2008/0129351 A1 | 6/2008 | Chawla | |
| 2009/0041020 A1 | 2/2009 | Gibbons et al. | |
| 2009/0310625 A1 | 12/2009 | Roberts et al. | |
| 2010/0100759 A1* | 4/2010 | Blixt et al. | 713/502 |
| 2010/0118895 A1 | 5/2010 | Radulescu | |
| 2010/0296524 A1 | 11/2010 | Rahbar | |
| 2011/0064091 A1 | 3/2011 | Darras et al. | |
| 2011/0150005 A1 | 6/2011 | Chen et al. | |

OTHER PUBLICATIONS

Written Opinion, PCT/US2012/055300, Dec. 10, 2012, 12 pgs.

Shenoi, "Performance Aspects of Timing in Next-Generation Networks", IEEE Communications Magazine, vol. 49, No. 2, Feb. 2011 (7 pages).

IEEE Std 1588, "Standard for a Precision Clock Synchronization Protocol for Networked Measurement and Control Systems," Jul. 2008 (289 pages).

RFC: 5905, IETF, "Network Time Protocol Version 4: Protocol and Algorithms Specification," Jun. 2010 (110 pages).

ITU-T Recommendation, G.8261/Y.1361, "Timing and Synchronization Aspects in Packet Networks," Apr. 2008 (112 pages).

* cited by examiner

SYSTEMS AND METHODS UTILIZING RANDOMIZED CLOCK RATES TO REDUCE SYSTEMATIC TIME-STAMP GRANULARITY ERRORS IN NETWORK PACKET COMMUNICATIONS

RELATED APPLICATIONS

This application claims priority to the following provisional application: U.S. Provisional Patent Application Ser. No. 61/539,806, filed Sep. 27, 2011, and entitled "SYSTEMS AND METHODS UTILIZING RANDOMIZED SLAVE TIME-STAMP CLOCK RATES TO REDUCE SYSTEMATIC TIME-STAMP GRANULARITY ERRORS IN NETWORK PACKET COMMUNICATIONS," which is hereby incorporated by reference in its entirety.

TECHNICAL FIELD OF THE INVENTION

This invention relates to the use of time-stamps in network packet communications and, more particularly, to time-stamp granularity errors in network communications.

BACKGROUND

One of the more important requirements of a digital communication network is to support real-time communications applications which, typically, require time or frequency alignment, or a combination of both. For example, time alignment is used by real-time instrumentation systems gathering data at specific time intervals or operating machinery according to specific timing. Frequency alignment is required in time-division-multiplexed (TDM) systems and in multi-media streaming systems, which require fixed, reproducible, video or audio sample rates across multiple clients.

While frequency alignment within conventional TDM networks is relatively straightforward, packet-switched networks, such as networks based on Internet Protocols ("IP"), present time and frequency alignment challenges because packet networks are not conventionally designed to provide precise delivery time for data or precise timing. A key difference is that the switching and multiplexing functions are not deterministic, as they are in TDM networks, but have a random aspect as well. In particular, packet networks typically involve multiple nodes that may store and forward data packets, potentially introducing significant, randomly distributed, transit delay variation between any two points.

To address time and frequency alignment challenges inherent in packet networks, certain protocols based on the industry standard internet protocol (IP) have been developed and deployed. One IP-based time alignment protocol is known as the Network Time Protocol (NTP). NTP is used for aligning time between a client and one or more master time references. Precision Time Protocol (PTP) is a second IP-based time alignment protocol for aligning one or more client devices to a master time reference. Both NTP and PTP provide for the use of syntonized time-stamp clocks (i.e, they are aligned in frequency) in master (sending) devices and slave (receiving) devices to produce time-stamps for achieving this alignment of time references. Master devices can be any of a variety of devices (e.g., communication sources, servers, etc.) that are sending packets to slave devices, which in turn can be any of a variety of devices that are receiving packets (e.g., communication destinations, clients, etc.).

FIG. 1 (Prior Art) is a conceptual deployment diagram that illustrates a slave clock in a slave device (destination/slave/client) 102 synchronizing to a master clock in a master device (source/master/server) 101 over a packet network 103. The packet timing signals 104 communicated over the packet network 103 include time-stamped packets exchanged between the master and slave devices at a nominally regular interval with, for example, $T_0$ time units (e.g., seconds) between packets. In FIG. 1 (Prior Art), the transit delay from the master device (source/master/server) 101 to the slave device (destination/slave/client) 102 is represented by the $\Delta_{MS}$ arrow 108. And the transit delay from the slave device (destination/slave/client) 102 to the master device (source/master/server) 101 is represented by the $\Delta_{SM}$ arrow 109. The slave device (destination/slave/client) 102 uses time-stamps associated with the packet timing signals 104 to generate local clock signals represented by clock output 105.

The nature of the timing signals is provided in FIG. 2 (Prior Art). The timing packet that traverses the network from master to slave leaves the master 210 at time $t_1$ (labeled as "A"). This constitutes the time-of-departure time-stamp. After a transit delay of $\Delta_{MS}$ 240, the packet arrives at the slave 220 at time $t_2$ (labeled as "B"). The slave measures this time-of-arrival as $\tau_2$ based on the slave clock. In other words, the time-stamp for time-of-arrival has the value $\tau_2$. Denoting by $\epsilon$ the time offset of the slave clock relative to the master clock, the time $t_2$ for the time-of-arrival at the slave 220 can be represented by the following equation:

$$t_2 = \tau_2 + \epsilon \quad \text{(Eq. 1)}$$

For packets originating at the slave 220 and transmitted to the master 210, the time-of-departure time-stamp contains $\tau_3$, which represents the slave-clock estimate of time-of-departure. The actual (based on the master timescale) time-of-departure $t_3$ (labeled as "C") is related to $\tau_3$ by the following equation:

$$t_3 = \tau_3 + \epsilon \quad \text{(Eq. 2)}$$

The transit delay across the network is $\Delta_{SM}$ 244. Thus, after a transit delay of $\Delta_{SM}$ 244, the packet arrives at the master 210 at time $t_4$ (labeled as "D").

Such a two-way exchange of packets can provide information suitable for allowing the slave to align in time with the master (assuming that both sides have knowledge of the time stamps). There are four measured values (time-stamps) that can be communicated between the Master and Slave, namely, timestamps associated with $t_1$, $\tau_2$, $\tau_3$, and $t_4$, which are described with respect to FIG. 2 (Prior Art). It is noted that this two-way exchange involves one packet (message) in each direction, and these messages do not necessarily have to be consecutive as long as the time-stamp information is communicated appropriately. In some instances, the rate at which packets are transmitted in the two directions can be different.

Denoting as $\tau_{MS}$ and $\Delta_{SM}$ the transit delays between the Master-to-Slave communication and Slave-to-Master communication, respectively, the following equations can be established:

$$t_4 = \tau_3 + \epsilon + \Delta_{SM} \text{ (from a S-to-M packet)}$$

$$t_1 = \tau_2 + \epsilon - \Delta_{MS} \text{ (from a M-to-S packet)} \quad \text{(Eq. 3)}$$

In this actual time-transfer situation, there are two equations with three unknowns. As such, it is common practice to assume reciprocity of transit delay between the two devices (i.e., assuming that $\Delta_{MS}$ equals $\Delta_{SM}$), thereby reducing the number of unknowns to two. Making this assumption and computing for $\epsilon$, this slave wall-clock time offset-from-master ("ofm") value $\epsilon$ can be indicated as follows:

$$\varepsilon = \frac{(t_4 + t_1) - (\tau_3 + \tau_2)}{2} = \frac{(t_4 - \tau_3) - (\tau_2 - t_1)}{2} \quad \text{(Eq. 4)}$$

There are several phenomena that interfere with the accuracy and precision whereby the slave clock can determine its time offset-from-master. One such error contribution is related to the basic nature of packet-switched networks whereby the transit delay of packets from source to destination can vary from packet to packet. This effect, also called packet delay variation (PDV), restricts the ability of the slave to align with the master perfectly. Further, because the oscillator in the slave clock is not ideal, it could drift between packet transmissions, and the assumption that the slave time clock offset-from-master ($\epsilon$) is "constant" over the interval of packet exchange is not exact. Several methods and techniques have been disclosed to address these kinds of error sources and mitigate their impact on the performance of the clock. These methods commonly apply low-pass filtering. That is, the noise type is random, and by applying suitable filtering methods, the noise power is reduced, improving the signal-to-noise ratio.

It is noted that for very high precision/accuracy time-transfer in packet networks, there are no intervening devices between the Master and the Slave. In PTP architectures, this lack of intervening devices is referred to as the networking providing "on-path support," and each intervening device between the end-point clocks is called a "boundary clock." In effect, each boundary clock is a slave clock on one side (e.g., the "upstream" or "Master" side) and a master clock on the other side (e.g., the "downstream" or "Slave" side). In this situation, the transit delay of packets from master/source to slave/destination is nominally constant.

One other source of error that has not been addressed previously is the error in the time-stamp value itself. If the time-stamp function provides an erroneous value for the time-of-departure or the time-of-arrival of a packet, then this error propagates into the estimate of the slave clock time offset-from-master. As described below with respect to FIG. 3A (Prior Art) and FIG. 3B (Prior Art), prior methods for generating time-stamps can introduce a time-stamp error that is static and, therefore, cannot be filtered out by traditional means. In boundary clock scenarios, this source of error is one of the primary contributors to the error in typical time transfer systems.

FIG. 3A (Prior Art) is a block diagram of an embodiment 300 for circuitry that generates a time-stamp for network packets. For this embodiment 300, a nominal packet rate is considered to be $f_0$, and the nominal packet interval is considered to be $T_0$, such that $f_0=1/T_0$. As shown in FIG. 3A (Prior Art), the time-stamp clock 306 (e.g., clock rate=$f_{TS}$) runs a counter 302. Transitions in the least-significant bit are associated with a time-equivalency of $\Delta_{TS}=1/f_{TS}$. (In some implementations, the increment is other than unity, allowing a different weight (in time units) than $\Delta_{TS}1=/f_{TS}$.) Thus, the effective granularity of the time-stamp is $\Delta_{TS}$.

For the embodiment 300 depicted, the event to be time-stamped (e.g., receipt of a packet from the network for time-of-arrival) generates a load-pulse 308 based upon an event trigger. This load-pulse 308 causes the counter 302 to be sampled to generate a time-stamp value, and this time-stamp value 303 is stored in the time-stamp register 304, which can output a time-stamp of the last event, if desired, or can be accessed in some other desired manner. The event time-stamps 305 can then be received and used in a slave device (Slave), for example, in synchronizing its operations to a clock from a master device (Master) on the network.

It is noted that it is incorrect to assume that the time-of-arrival of a packet is necessarily aligned to an edge of the time-stamp clock ($f_{TS}$). Consider the case of time-stamp $T_2$ representing the Slave's estimate of the time-of-arrival of a packet sent by the Master, as discussed in more detail with respect to FIG. 3B (Prior Art) below. The Slave's time-stamp mechanism does not influence what time the Master sends the packet, and also the Slave does not have any control over the transit delay of the packet over the medium. In the Slave, the signal processing, for example, associated with demodulation of the signal, clock-and-data recovery, and/or determination of the appropriate bit rate, initiates a strike of a slave time-stamp based upon an event, such as the load pulse 308 in FIG. 3A (Prior Art). The Slave time-stamp clock edge used to generate the time-stamp is likely not to align exactly with the actual time of receipt of the packet.

Thus, all events that occur between $n \cdot \Delta_{TS}$ and $(n+1) \cdot \Delta_{TS}$ will map into the same time-stamp value for the Slave device. This ability to generate time-stamps for events only at the precision of the time-stamp clock is the notion of quantization or granularity of the time-stamp. Put another way, there is an uncertainty of $\Delta_{TS}$ associated with a time-stamp as compared to the actual time of the event in continuous time.

In practice, time-stamps are taken in pairs. Specifically, the time offset-from-master (ofm) as computed by the Slave is given by the following equation:

$$ofm(n) = \frac{(T_4(n) + T_1(n)) - (T_3(n) + T_2(n))}{2} \qquad \text{(Eq. 5)}$$

where $T_4(n)$ and $T_1(n)$ are the time-of-arrival and time-of-departure time-stamps struck at the Master and $T_2(n)$ and $T_3(n)$ are the time-of-arrival and time-of-departure time-stamps struck at the Slave. The index (n) represents the notion of the ofm being calculated using the $n^{th}$ packet exchange.

The primary reason for associating the time-stamps as shown in Equation 5 above is to recognize that $T_1$ and $T_4$ are "Master" time-stamps (generically designated in the figures as $TS_M$) and $T_2$ and $T_3$ are "Slave" time-stamps (generically designated in the figures as $TS_S$). Consequently $T_1$ and $T_4$ are struck at the same port and, likewise, $T_2$ and $T_3$ are struck at the same port. On the slave side, the time-stamp granularity noise can be written as $$\varepsilon_{TS}^{(S)}(n) = -\frac{1}{2} \cdot (\varepsilon_3(n) + \varepsilon_2(n)) \qquad \text{(Eq. 6)}$$

where $\epsilon_3(n)$ and $\epsilon_2(n)$ are the time-stamp granularity noise contributions for time-stamps $T_3(n)$ and $T_2(n)$, respectively. The negative sign is solely for convenience. When considering errors, the more relevant metrics are related to power, and for power, the sign is moot. Likewise, on the Master side, the time-stamp granularity noise can be written as $$\varepsilon_{TS}^{(M)}(n) = -\frac{1}{2} \cdot (\varepsilon_4(n) + \varepsilon_1(n)) \qquad \text{(Eq. 7)}$$

where $\epsilon_4(n)$ and $\epsilon_1(n)$ are the time-stamp granularity noise contributions for time-stamps $T_4(n)$ and $T_1(n)$, respectively.

FIG. 3B (Prior Art) is a timing diagram of an embodiment 350 for communication of a packet involving a Master time-stamp 356 and a Slave time-stamp 358. For prior solutions, the clock rate for the Master time-stamp clock 354 is the same as the clock rate for the Slave time-stamp clock 352. The time-of-departure 360 represents when the packet is transmitted by the Master and first time-stamp ($T_1$) 356 represents the Master time-stamp. The time-of-arrival 364 represents when the packet is received by the Slave, and the flight time 362 represents the time the packet takes to travel from Master to Slave. The second time-stamp ($T_2$) 358 represents the time-stamp struck at the Slave for the transmitted packet. The difference between the clock edge representing this time-stamp ($T_2$) 358 and the actual time-of-arrival 364 is represented as time difference ($\Delta$) 370.

Considering this case where a time-stamped packet is transmitted from the Master to the Slave, the time-of-departure 360 is assumed to be aligned with an edge of the time-stamp clock in the master, although it could be misaligned in practice. However, this misalignment is static in nature. The packet is delivered over the medium, for example, at 1 Gbit/s Ethernet, and arrives at the Slave (receiver) where the time-of-arrival is established. For a given situation, the flight time 362 over the medium can be considered essentially constant from packet to packet.

In legacy and conventional network communication systems, the time-stamp clock 352 in the Slave (receiving device) is implemented using the same nominal rate as that of the time-stamp clock 354 for the Master (sending device). A typical value for the clock rate for 1-Gbit/s Ethernet, for example, is 125 MHz, corresponding to a time-stamp time granularity of 8 ns.

As depicted in FIG. 3B (Prior Art) a time-stamped packet leaves the Master (time-stamp=$T_1$) and it leaves on the rising edge of the time-stamp clock 354. The time-stamp 356 has no granularity error associated with it because of the assumption that the time-of-departure 360 is aligned with an edge of the time-stamp clock 354.

The packet arrives at the Slave (receiver) after some time represented by the flight time 362. At the Slave (receiver), there is some granularity error because there is no guarantee that the time-of-arrival 364 will be in alignment with an edge of the time-stamp clock 352. As depicted in embodiment 350, the time-stamp associated with time-of-arrival 364 will be the value of the clock at the closest edge prior to the time-of-arrival. This is designated as slave time-stamp ($T_2$) 358. The time-stamp granularity error is A or the difference 370 between the clock edge for time-stamp clock 352 and the actual time of arrival 364.

Three cases can be considered for different aspects of errors associated with the time-stamp by the Slave (receiver).

First is a case where the slave clock 352 is syntonized with the master clock 356 (i.e., they are aligned in frequency). In this case, the rates of the time-stamp clocks nominally will be the same, and as a consequence, the phase difference between the two clock waveforms shown in FIG. 3B (Prior Art) will be a constant if the two clocks have the same nominal rate (in Hz). Because the flight time 362 can be assumed to be the same for each packet, it follows that the time-stamp granularity error ($\Delta$) 370 will be the same for each packet. Such a systematic granularity error is impossible to filter out in subsequent processing. This effect is sometimes referred to as the "beating effect." The slave time-clock will thus be different from the master time-clock because of this systematic phenomenon, and the error will be some value between 0 and $\Delta_{TS}$ where $\Delta_{TS}$ is the period of the time-stamp clock (e.g., 0-8 ns for a 125 MHz clock).

Next is a case where the slave clock is almost syntonized with the master clock (i.e., they are almost aligned in frequency and the offset is small and almost constant and the nominal rate of the time-stamping clocks is the same). In this case, the frequency, and therefore the rate, of the time-stamp clocks 352 and 354 will be the almost same. As a consequence, the phase difference between the two clock waveforms will be almost the same and will change slowly over time. Because the flight time 362 is again assumed to be the same for each packet, it follows that the time-stamp granularity error ($\Delta$) 370 will almost be the same for each packet. Such a low-frequency error is hard to filter out, for example, using a low-pass filter. The slave time-clock will thus be different from the master time-clock because of this phenomenon, and the error will be some value between 0 and $\Delta_{TS}$ where $\Delta_{TS}$ is the period of the time-stamp clock (e.g., 0-8 ns for a 125 MHz clock), and this error will change slowly over time.

Third is a case where the slave clock is not syntonized with the master clock (i.e., they are not aligned in frequency). For this case, even if the nominal rate of the time-stamp clocks is the same, they will drift with respect to each other. As a consequence the phase difference between the two clock waveforms shown in FIG. 3B (Prior Art) will not be a constant. Because the flight time 362 is the same for each packet, it follows that the time-stamp granularity error ($\Delta$) 370 will not be the same for each packet and will be have high Fourier frequency content. Such a high frequency error is possible to filter out, for example, using low-pass filter techniques. However, this situation will likely occur only during start-up and reset of the Slave/Master devices. In steady-state operation, the Slave is synchronized to the Master, and this implies that the slave clock and master clock will almost be the same frequency, and this operation will therefore reduce to either the first or second case described above.

These cases will occur, for example, between Master and Slave communications for Gigabit/sec Ethernet communications where the MII (media independent interface) clock rate (e.g., 125 MHz) is used by both the Master and Slave devices to generate time-stamps for network synchronization.

Prior systems and techniques do not provide the ability to handle these cases where small systematic granularity errors exist with respect to Master and Slave time-stamp clocks that are operating at the same nominal rate, such as the MII (media independent interface) clock rate (e.g., 125 MHz) for Gigabit/sec Ethernet communications.

SUMMARY OF THE INVENTION

Systems and methods are disclosed for utilizing slave (receive) time-stamp clock rates that are different from the master (sender) time-stamp clock rates to randomize and thereby reduce systematic time-stamp granularity errors in the communication of network packets. In some embodiments, the slave (receive) time-stamp clock rate is set to be a fixed value that has a relationship with respect to the master (sender) time-stamp clock rate such that the ratio of the slave (receive) clock rate to the master (sender) clock rate is a rational number. Further, this rational number preferably has a large denominator to represent that many cycles of the master (sender) time-stamp clock are required before its edge aligns with an edge of the slave (receive) time-stamp clock. Other embodiments use a time-varying frequency for the slave (receive) time-stamp clock rate to randomize the slave (receive) time-stamp clock with respect to the master (sender) time-stamp clock. This time-varying frequency can also be implemented so that over time, the average value for the slave (receive) time-stamp clock rate is equal to a rational multiple of an average value for the master (sender) time-stamp clock rate, although this time-varying approach is also applicable for the case where the master (sender) and slave (receive) time-stamp clock rates are different over time. In further embodiments, spread spectrum techniques (e.g., applying a pseudo-random spreading code) or delta-sigma modulation techniques are applied to effectively randomize the slave (receive) time-stamp clock to achieve this time-varying result. Still further, additional time-stamps can be generated using a traditional slave (receive) time-stamp clock signal having a rate set to equal the rate of the master (sender) time-stamp clock signal. These additional time-stamps can be used along with the randomized time-stamps described herein and the master (sender) time-stamps to identify the existence of a systematic granularity error and its magnitude. Other features and variations can be implemented, if desired, and related systems and methods can be utilized, as well.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

Figure 1:
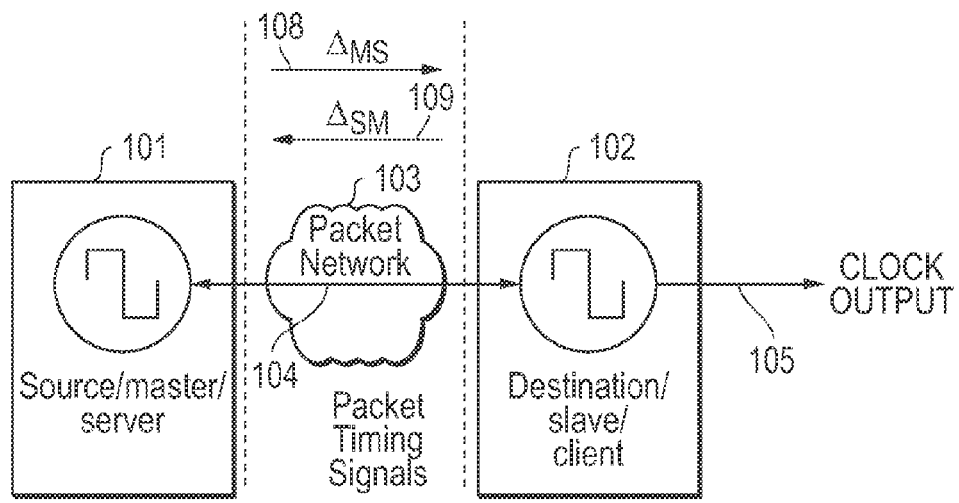
FIG. 1 (Prior Art) is a block diagram of packet-based communications where a slave clock is synchronized to a master clock over a packet-switched network.
Figure 2:
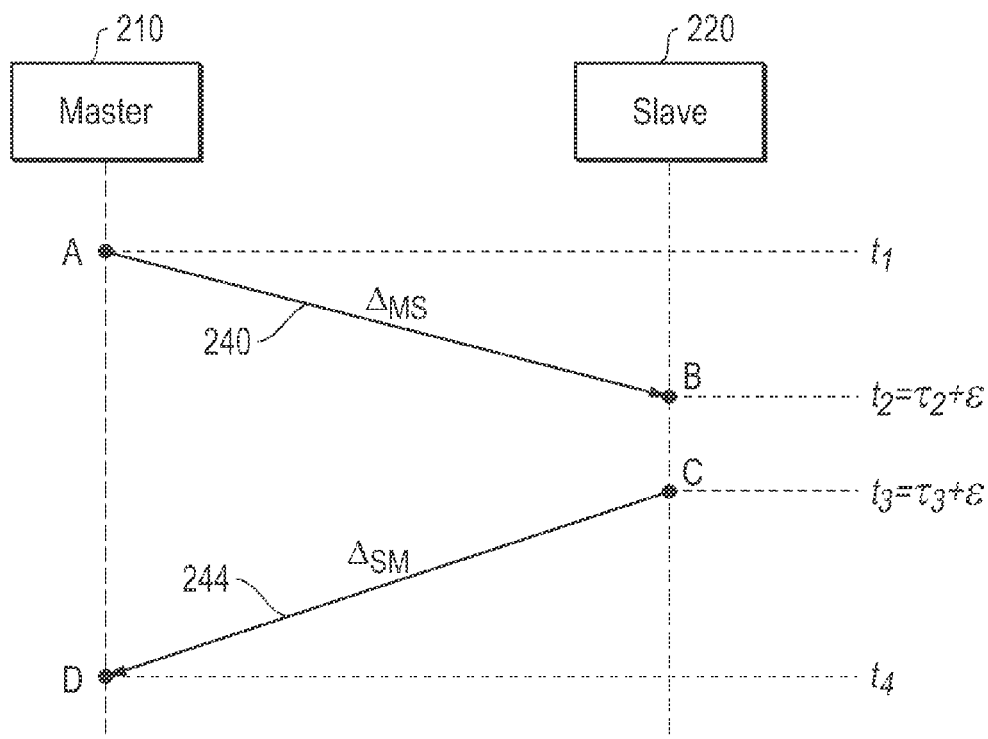
FIG. 2 (Prior Art) is a timing diagram of packet-based methods for synchronization involving master time-stamps and slave time-stamps.

Systems and methods are disclosed for utilizing randomized slave (receive) time-stamp clock rates that are different from master (sender) time-stamp clock rates to reduce systematic time-stamp granularity errors in the communication of network packets. Various features and variations can be implemented, if desired, and related systems and methods can be utilized, as well.

Network communication protocols utilize time-stamps to facilitate the synchronization of network communications. As described above, many traditional time-stamping methods use a clock rate that is the same for the Master (source/master/server) and Slave (destination/slave/client) devices. For example, with respect to Gigabit/sec Ethernet communications, the MII (media independent interface) clock rate (e.g., 125 MHz for) may be used by master (sender) and slave (receive) devices to generate time-stamps for network synchronization. However, as further described above, this use of syntonized, equi-rate, time-stamp clocks gives rise to anomalies in the time-stamp granularity error, and these systematic granularity errors are difficult if not impossible to filter out.

The randomized slave time-stamps described herein reduce systematic errors in granularity noise experienced by the network communications. More particularly, the methods and systems described herein reduce these systematic granularity errors by intentionally offsetting or randomizing the Slave (receive) clock rate used to generate time-of-arrival time-stamps from the Master (sender) clock rate used to generate time-of-departure time-stamps. Further, by making the rates relatively prime with respect to each other, or otherwise randomizing the rates with respect to each other, the spectral characteristics of the time-stamp granularity noise can be spread out over a wide Fourier-frequency range making these errors relatively easy to filter out. This improved noise spectrum permits more accurate synchronization of network packet communications.

As described above, on the slave side, the time-stamp granularity noise can be written as follows:

$$\varepsilon_{TS}^{(S)}(n) = -\frac{1}{2} \cdot (\varepsilon_3(n) + \varepsilon_2(n)) \qquad (\text{Eq. 6})$$

where $\epsilon_3(n)$ and $\epsilon_2(n)$ are the time-stamp granularity noise contributions for time-stamps $T_3(n)$ and $T_2(n)$, respectively. The negative sign is solely for convenience. When considering errors the more relevant metrics are related to "power" and for that the sign is moot. Likewise, on the master side, the time-stamp granularity noise can be written as follows:

$$\varepsilon_{TS}^{(M)}(n) = -\frac{1}{2} \cdot (\varepsilon_4(n) + \varepsilon_1(n)) \qquad (\text{Eq. 7})$$

where $\epsilon_4(n)$ and $\epsilon_1(n)$ are the time-stamp granularity noise contributions for time-stamps $T_4(n)$ and $T_1(n)$, respectively.

According to the techniques described herein, by applying a randomization technique to the Slave clock rate as compared to the Master clock rate, the behavior of $\{\epsilon_2(n)\}$ and $\{\epsilon_4(n)\}$ granularity noise becomes in effect a uniformly-distributed, white-noise, random process with respect to time-of-arrival time-stamps generated by the Slave device. Further, the $\{\epsilon_1(n)\}$ and $\{\epsilon_3(n)\}$ granularity noise for the time-of-departure time-stamps can be reasonably assumed also to be a uniformly-distributed, white-noise, random process. As random processes, these errors can be removed with subsequent processing, such as through the use of filtering techniques. As such, the granularity noise caused by systematic granularity errors introduced by syntonized but offset time-stamp clocks can be effectively reduced or removed by using the randomized slave time-stamping techniques described herein.

It is further noted that the Master (sender) device referred to herein can be considered any desired sending, transmitting and/or source device, and the Slave (receive) device referred to herein can be considered any desired receiving and/or destination device. In most network communication systems, devices both send and receive network packets. As such, these network devices would be both Master or sending devices when sending or transmitting packets that include sender time-stamps, and these devices would be Slave or receiving devices when receiving packets and generating receive time-stamps.

Figure 4:
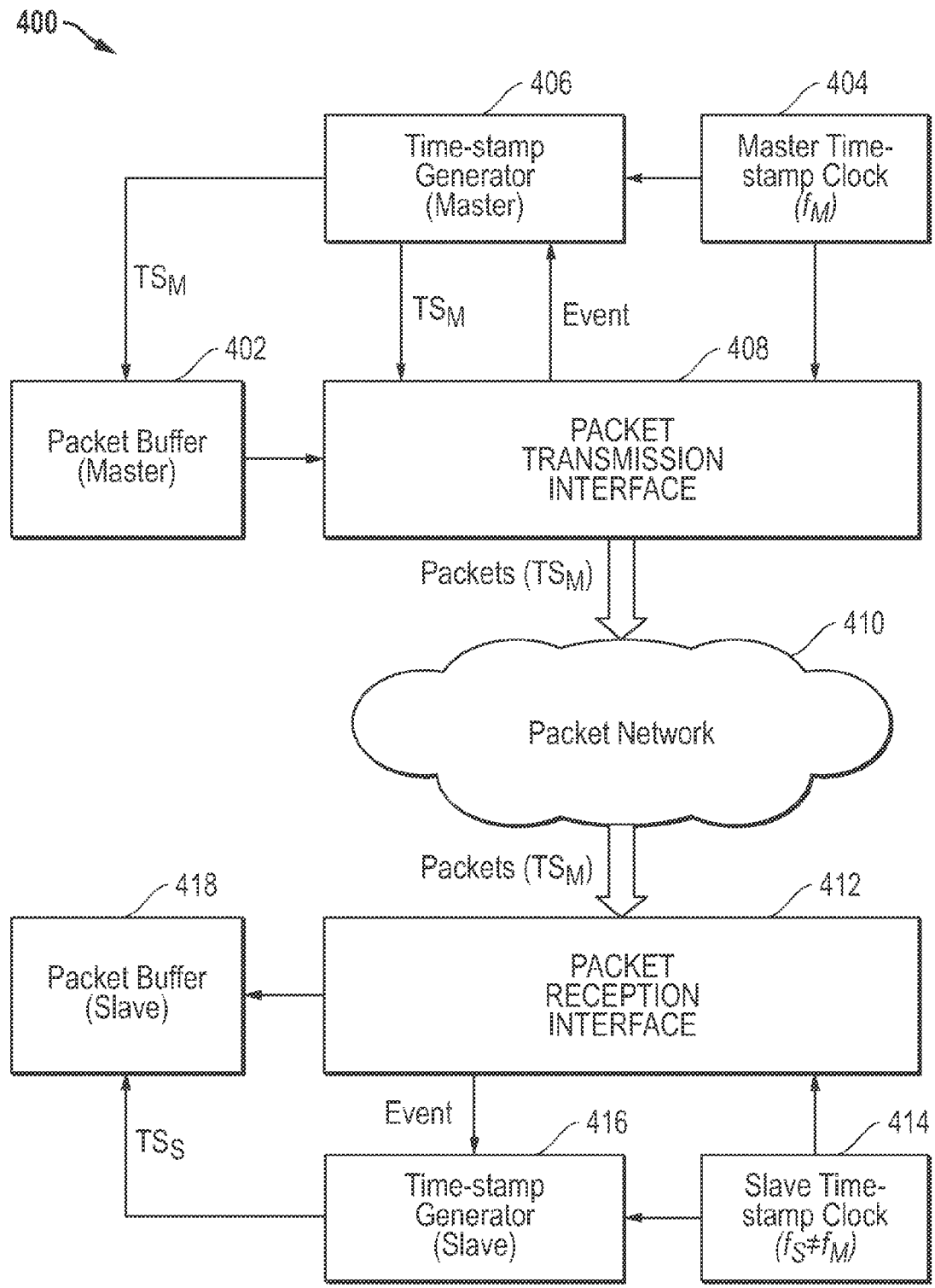
FIG. 4 is a block diagram of an embodiment for a system utilizing a slave time-stamp clock having a rate that is different from the rate of the master time-stamp clock.

FIG. 4 is a block diagram of an embodiment 400 for a system utilizing randomized time-of-arrival time-stamp clocks, as described herein, that have clock rates for slave time-stamp clocks that are intentionally different from the clock rates for the master time-stamp clocks. For convenience, the master-to-slave direction is considered with respect to FIG. 4, as the reverse from slave-to-master would be similar. As depicted, the Master time-stamp clock 404 has a master clock rate ($f_M$), and the Slave time-stamp clock 414 has a slave clock rate ($f_S$) that is intentionally different from the Master time-stamp clock rate ($f_S \neq f_M$). This randomizing of clock rates allows for systematic granularity errors to be reduced or eliminated with downstream filtering techniques, such as low-pass filters in clock recovery loops.

It is again noted that the master device is the sender device sending or transmitting the initial timing packets, and the slave device is the receive device receiving the these timing packets. The slave device will typically then send back timing packets to the master device. It is further noted that any particular device that is participating in network communications can be a master/sender device (i.e., sending, transmitting and/or source device), a slave/receive device (i.e., receiving and/or destination device), or can be both a master and a slave device, depending upon the direction of the timing packet communications occurring across the network.

Looking in more detail to embodiment 400, a master packet buffer 402 provides packets to a packet transmission interface 408 where master time-stamps ($TS_M$) are inserted into timing packets. These packets that include master time-stamps ($TS_M$) are then transmitted from the master device through network 410 to a packet reception interface 412 at a slave device. To generate the master time-stamps ($TS_M$), the master time-stamp clock ($f_M$) 404 provides a timing signal to the packet transmission interface 408 and the master time-stamp generator 406. The master time-stamp generator 406 then provides master time-stamps ($TS_M$) to the packet transmission interface 408 for inclusion in outgoing packets. In some implementations, the time-stamp ($TS_M$) is provided to the master packet buffer 402 and inserted into a subsequent packet.

To generate slave time-stamps ($TS_S$), the slave time-stamp clock ($f_S$) 414 provides a timing signal to the packet reception interface 412 and to the slave time-stamp generator 416. The packet reception interface also provides an event signal (EVENT) to the time-stamp generator 416 to indicate the reception of a packet. The slave time-stamp generator 416 then provides slave time-stamps ($TS_S$) to the slave packet buffer 418, where the master time-stamps ($TS_M$) are recovered and stored along with the slave time-stamps ($TS_S$). These time-stamps ($TS_M$, $TS_S$) can then be used by the Slave device to synchronize its operations to the Master clock and/or for other desired purposes.

Figure 3A:
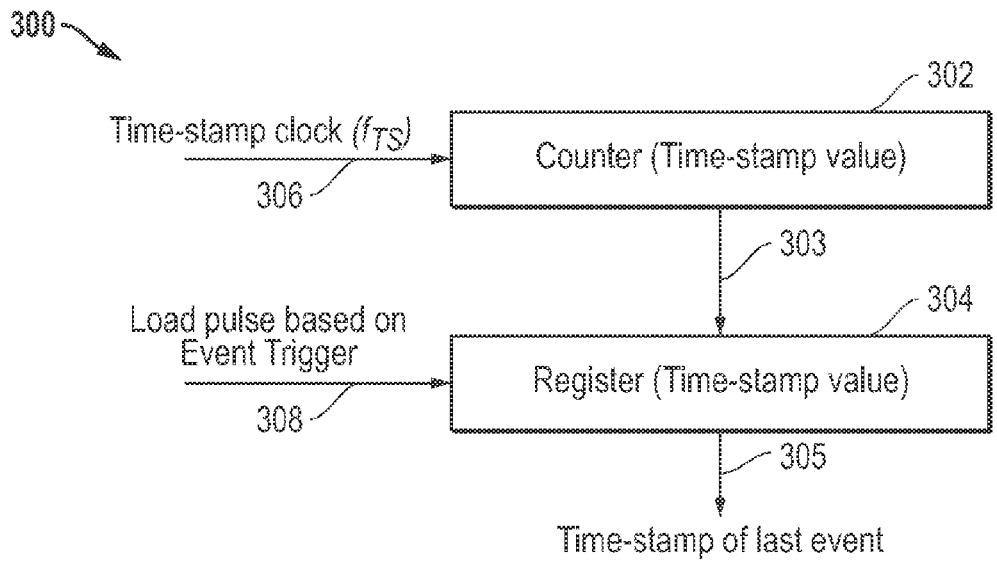
FIG. 3A (Prior Art) is a block diagram representing a traditional approach to generating time-stamps.

Advantageously, by randomizing the slave clock frequency and thereby the rate ($f_S$) for the Slave time-stamp clock 414 with respect to the master clock frequency and thereby the rate ($f_M$) for the Master time-stamp clock 404, systematic granularity errors can effectively be reduced or eliminated by subsequent processing of the time-stamps, for example, in timing recovery circuitry using low-pass filtering techniques. It is noted that the master (sender) time-stamp generator 406 and the slave (receiver) time-stamp generator 416 can include a time-stamp counter and a time-stamp register, as shown in FIG. 3A (Prior Art). And the master time-stamp clock 404 and slave time-stamp clock 414 can be used to control the counting operation of the counters with the time-stamp register being configured to store a time-stamp based upon the occurrence of the detected event.

It is further noted that the randomizing techniques described herein share a common principle wherein the time-stamp clock at the slave (receiver) has a rate that is randomized with respect to and/or different from, and preferably relatively prime to, the rate of the time-stamp clock in the master (transmitter). And because the slave possesses knowledge of the variations of its time-stamp clock, it can use this knowledge to achieve enhanced performance. Whereas the slave and master time-stamp may be traditionally synchronized and, therefore, the frequency offset is very small (i.e., nearly zero parts-per-million or almost zero in fractional frequency units), by making sure that the rates of the clocks are different, the relative phase of the time-stamp clock edges will change from clock-cycle to clock-cycle and therefore from packet to packet. Thus, because the relative phases are different from clock-cycle to clock-cycle, the instantaneous phase between the master clock and the slave clock will be different over time. The implication of this randomizing is that the time-stamp granularity error will not be constant and will have significant high-frequency components. These high-frequency components can effectively be filtered out by subsequent processing, such as through the use of low-pass filtering techniques included within a clock recovery phase-locked-loop.

The randomization of the slave time-stamp clock can be illustrated with the following examples.

Figure 3B:
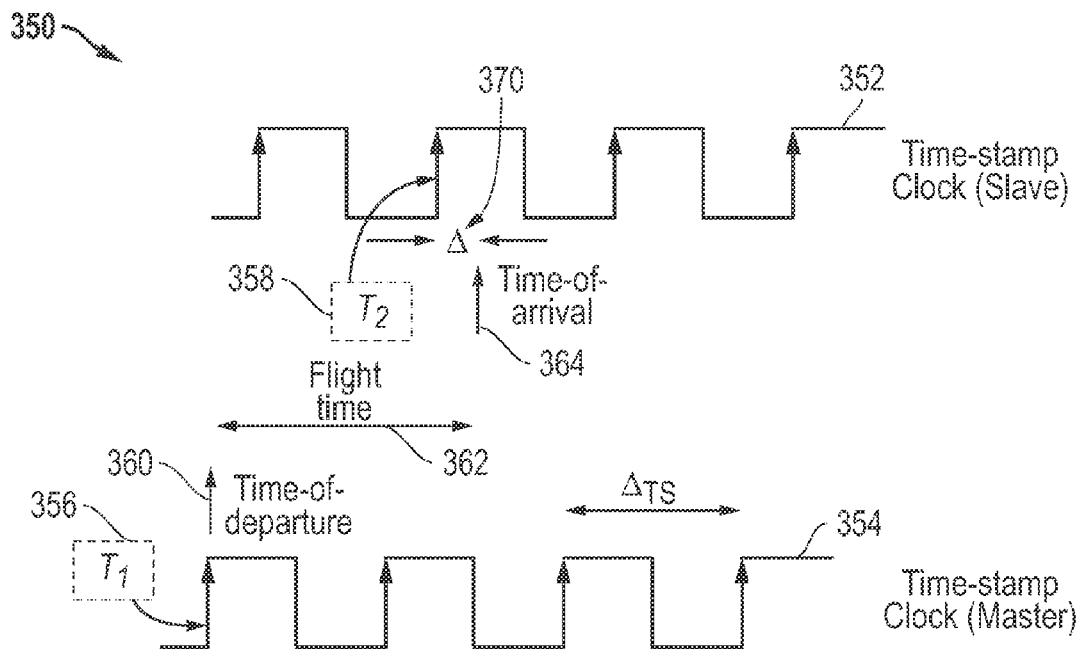
FIG. 3B (Prior Art) is a timing diagram that reflects the time-stamp granularity error introduced in traditional approaches.

Suppose the master side delivers packets that, for the purposes of illustration, are aligned to a rising edge of the nominal transmit time-stamp clock in the Master. Assume that the nominal rate of this clock is $f_M$ and that the time-stamp clock rate in the receiver is $f_S$. Also, further assume that $f_S > f_M$. If the ratio of the time-stamp clock frequencies ($f_S/f_M$) is an integer, say K, then a packet time-of-arrival will always be a fixed time offset from the closest rising edge of the receive time-stamp clock just prior to the time-of-arrival. This is indicated by the difference ($\Delta$) 370 in FIG. 3B (Prior Art) for the case K=1. It is noted that the ratio can also be considered with respect to clock time periods of the master clock time period ($T_M$) to the slave clock time period ($T_S$), such that the ratio is $T_M/T_S$.

In contrast, if the frequency ratio ($f_S/f_M$) is not an integer but is, for example, a rational number such as R/T, then there are exactly R cycles of the receive time-stamp clock for every T cycles of the transmit time-stamp clock. Depending on which edge the transmit packet is aligned with, there will be T different possible values for the difference ($\Delta$) 370. As recognized with respect to the randomized slave time-stamp clocks implementations described herein, this rational number relationship (K=R/T) is an improvement over the case where K=1, such that there is only one value for the difference ($\Delta$) 370. As described above, one value for the difference ($\Delta$) 370 leads to systematic granularity errors that cannot be detected or removed.

It is noted that the larger the value of T (e.g., R and T have few common factors), the more random will be the value of the difference ($\Delta$) 370. And if the rates are relatively prime, then T is effectively infinite, and the differences ($\Delta$) 370 for a plurality of packets will be uniformly distributed over the time interval [0, $\Delta_S$] where $\Delta_S = 1/f_S$ represents the period of the receive time-stamp clock. It is noted that relatively prime refers to two integers that relate to each other such that one is greater than 1000 after common factors are removed.

Thus, it is desirable to randomize the Slave time-stamp clock rate with respect to the Master time-stamp clock rate such that the ratio of their clock rates is not an integer but is a rational number. And it is further desirable that this rational number be such that it takes a large number of master timestamp clock cycles (T) before an edge of the master timestamp clock aligns with an edge of the slave time-stamp clock cycles (R).

Whereas a large value of T is preferable, it may be infeasible to make T extremely large (such as approaching infinity). One guideline for choosing T is to make the natural period larger than the time-constant of the subsequent low-pass filtering function. For example, if the time constant of the clock recovery loop is 1000 seconds, and the nominal packet rate is 1 second, then choosing T to be greater than 1000 (e.g., 1024) is a good compromise between implementation complexity and performance. It is noted that as T increases from T=1, which was used in prior solutions where K=R/T=1, to 1024 or higher, a continual improvement in performance will be achieved. However, for the example described, increasing T beyond 1024 may lead to a further improvement in performance that is not so dramatic.

Figure 5:
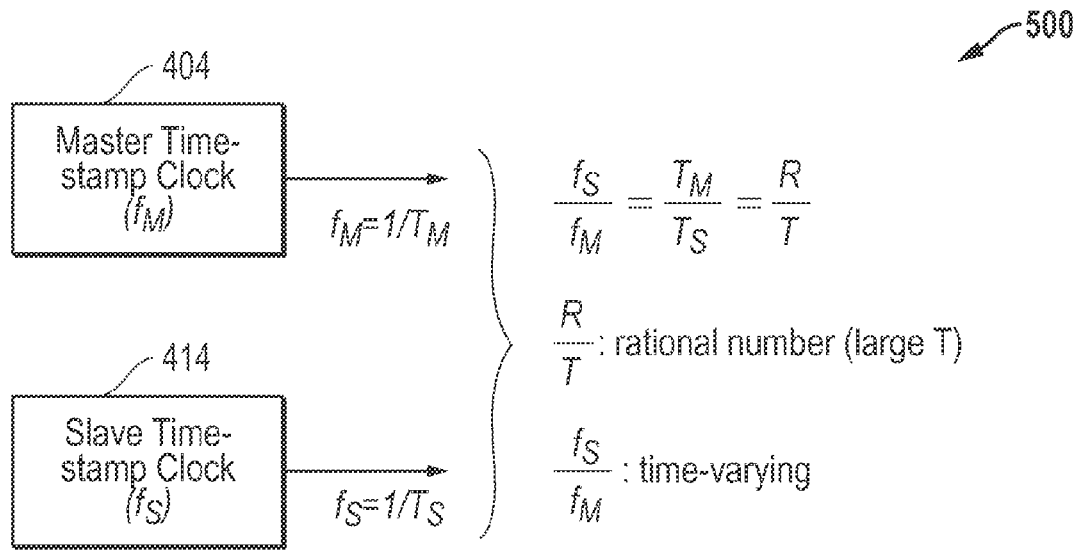
FIG. 5 is a block diagram representing example embodiments having different clock rates for the Master and Slave time-stamp clocks.

FIG. 5 is a block diagram of an embodiment 500 implementing a solution where the ratio of the time-stamp clock frequencies ($f_S/f_M$) is a rational number represented by R/T. As depicted, slave time-stamp clock 414 has a slave clock frequency ($f_S$) that is related to the master clock frequency ($f_M$) of the master time-stamp clock 404 by a non-integer number. As such, the ratio of the time-stamp clock frequencies ($f_S/f_M$) is a rational number. This relation can be represented by the following equation:

$$(f_S/f_M)=(T_M/T_S)=R/T \quad \text{(Eq. 8)}$$

where R/T is preferably a rational number (i.e., R and T are integers), and where T is preferably a large number.

As one implementation, the slave time-stamp clock rate ($f_S$) can be selected to be slightly offset from the master time-stamp clock rate ($f_M$). For example, with respect to a master time-stamp clock rate of 125 MHz, as describe above for Gigabit/sec Ethernet communications, a slave time-stamp clock rate of 124 MHz would be an advantageous rate to choose. Other unrelated (e.g., non-integer related) clock rates with respect to the master clock rate could also be selected for the slave time-stamp clock rate ($f_S$), as desired. Further, clock rates that have an integer relationship greater than one could also be used, such that the ratio of their rates (K) is an integer greater than one (e.g., K=R/T, T=1, and R>1). This selection of unrelated and/or different clock rates for the slave time-stamp clock effectively randomizes the granularity errors that would otherwise be systematic granularity errors in prior solutions where slave time-stamp clocks are intentionally syntonized with the master time-stamp clock and have the same nominal clock rate ($f_S \approx f_M$).

In addition to selecting a fixed slave time-stamp clock rate ($f_S$) that is unrelated to the master time-stamp clock rate ($f_M$), the slave time-stamp clock rate ($f_S$) could also be varied over time to randomize the slave time-stamp clock rate ($f_S$) with respect to the master time-stamp clock rate ($f_M$). As such, the frequency ratio ($f_S/f_M$) addressed above could be nominally equal to one but would be time-varying about this nominal value. By using such a time-varying clock rate ($f_S$) for the slave time-stamp clock, the slave time-stamp clock rate ($f_S$) would still be different from or randomized with respect to the master time-stamp clock rate ($f_M$) and provide the advantages described herein. Further, if desired, the slave time-stamp clock frequency can be varied over time such that it has the same average frequency as the frequency for the master time-stamp clock. For example, the slave time-stamp clock rate ($f_S$) could be implemented by having a clock frequency that is syntonized with the master clock rate ($f_M$) but that also has intentional phase variations (which are also known as jitter or spread spectrum clocking). In summary, a time-varying slave frequency, and an average slave frequency matching the master frequency, can be represented with the following equations:

$$(f_S/f_M)=(T_M/T_S)=\text{time-varying} \quad \text{(Eq. 9)}$$

$$(f_S/f_M)\text{AVERAGE}=(T_M/T_S)\text{AVERAGE}=1 \quad \text{(Eq. 10)}$$

In one example, a time-varying slave clock rate ($f_S$) that has an average nominal value equal to the master clock rate ($f_M$), or equal to a rational multiple of an average value for the master clock rate ($f_M$), could be implemented using spread spectrum techniques. In other words, the slave time-stamp clock can be implemented as a spread spectrum clock, where the clock frequency is spread over a relatively wide range of frequencies instead of being concentrated at a single clock/carrier frequency. In such an embodiment, the slave time-stamp clock rate ($f_S$) can be nominally set to equal the master time-stamp clock rate ($f_M$), and the slave time-stamp clock rate ($f_S$) can then be intentionally dithered using spread spectrum techniques (e.g., applying a pseudo-random spreading code) to randomize the slave time-stamp clock with respect to master time-stamp clock, thereby allowing for systematic granularity errors to be reduced or eliminated.

It is noted that other randomizing techniques could also be applied to the slave time-stamp clock, as desired, to randomize the slave time-stamp clock rate ($f_S$) with respect to master time-stamp clock rate ($f_M$) so that systematic granularity errors can be reduced or eliminated. One particular example of a randomizing technique that can be applied is delta-sigma modulation, especially higher order delta-sigma modulation, which produces randomness having the advantageous property that the spectral components of the noise are shaped to be predominantly high frequency and which further simplifies the aforementioned low-pass filtering process.

Figure 6:
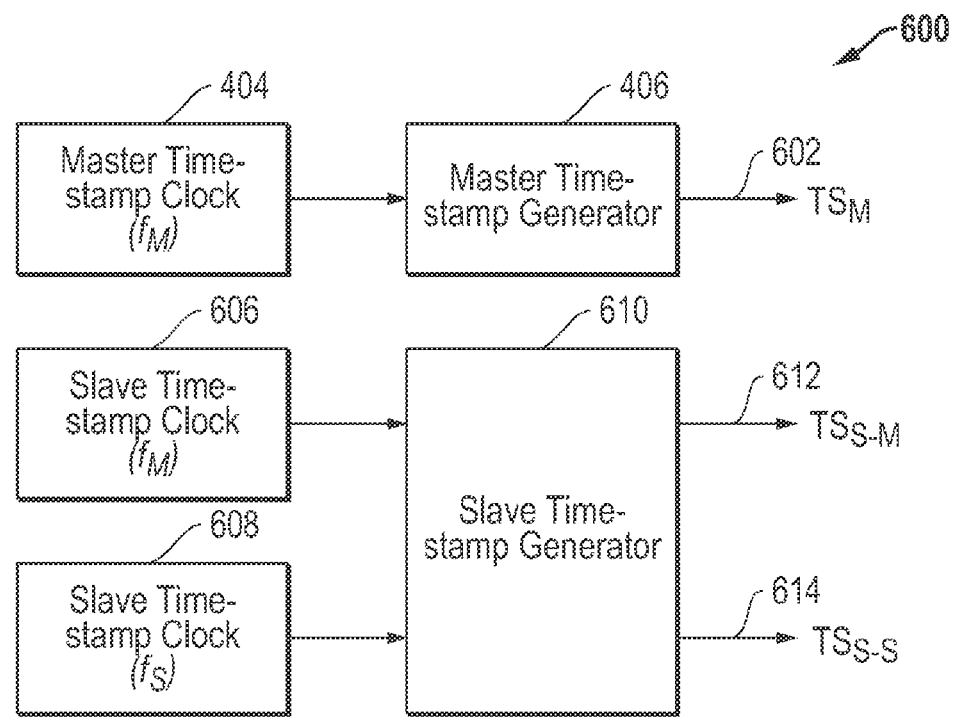
FIG. 6 is a block diagram of an embodiment where a traditional syntonized time-stamp and a randomized time-stamp are used to detect a systematic granularity error.

FIG. 6 is a block diagram of an embodiment 600 for a implementation where two time-stamps are used to detect a systematic granularity error. As depicted, a master time-stamp clock ($f_M$) 404 is provided to a master time-stamp generator 406 to produce a master time-stamp ($TS_M$) 602. As described herein, a slave time-stamp ($TS_{S-S}$) 614 is generated by slave time-stamp generator 610 using a randomized slave time-stamp clock 608 operating at a rate ($f_S$) that is different from the rate ($f_M$) of the master time-stamp clock 404. In addition, a slave time-stamp ($TS_{S-M}$) is also generated by the slave time-stamp generator 610 using a standard slave time-stamp clock 606 operating at a rate ($f_M$) implying that is the same rate, and possibly syntonized, with the master time-stamp clock 402.

By taking time-stamps using both a standard syntonized slave time-stamp clock 606 and a randomized slave time-stamp clock 608 at the same time, a determination can be made of the existence and magnitude of any systematic granularity errors being experienced by the system. In other words, while time-stamps struck using the syntonized slave time-stamp clocks, according to prior solutions, lead to systematic granularity errors, time-stamps struck using the randomized slave time-stamp clocks described herein provide time-stamps from which such granularity errors can be removed. Thus, further time-stamp processing, such as statistical analysis of the two timestamps (e.g., syntonized, randomized), can be used to indicate that the systematic granularity error is present and to indicate the magnitude of this error.

Figure 7A:
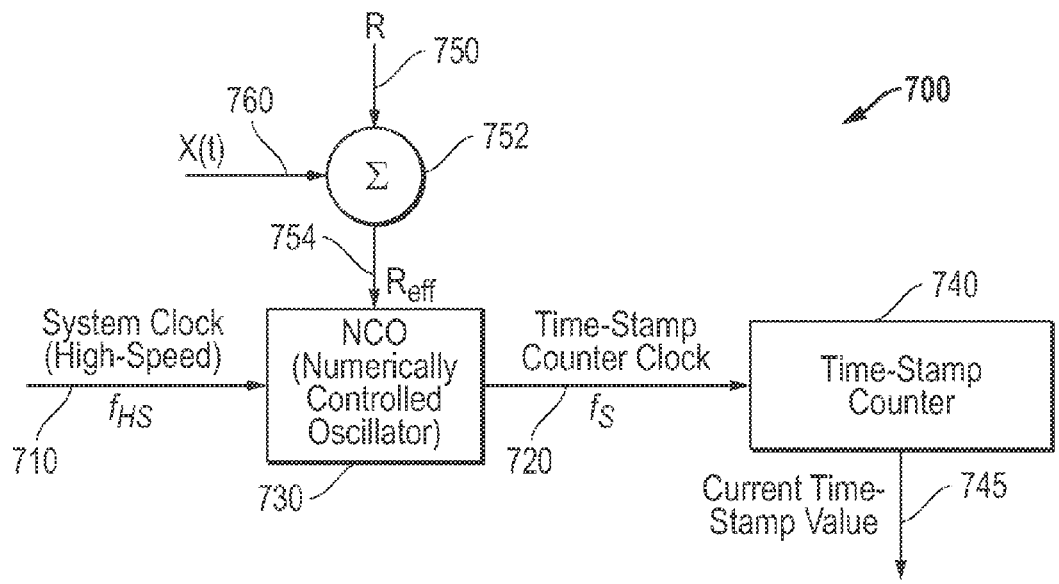
FIG. 7A is a block diagram of an embodiment for using a spread spectrum technique for randomization of time-stamp counter effective values.
Figure 7B:
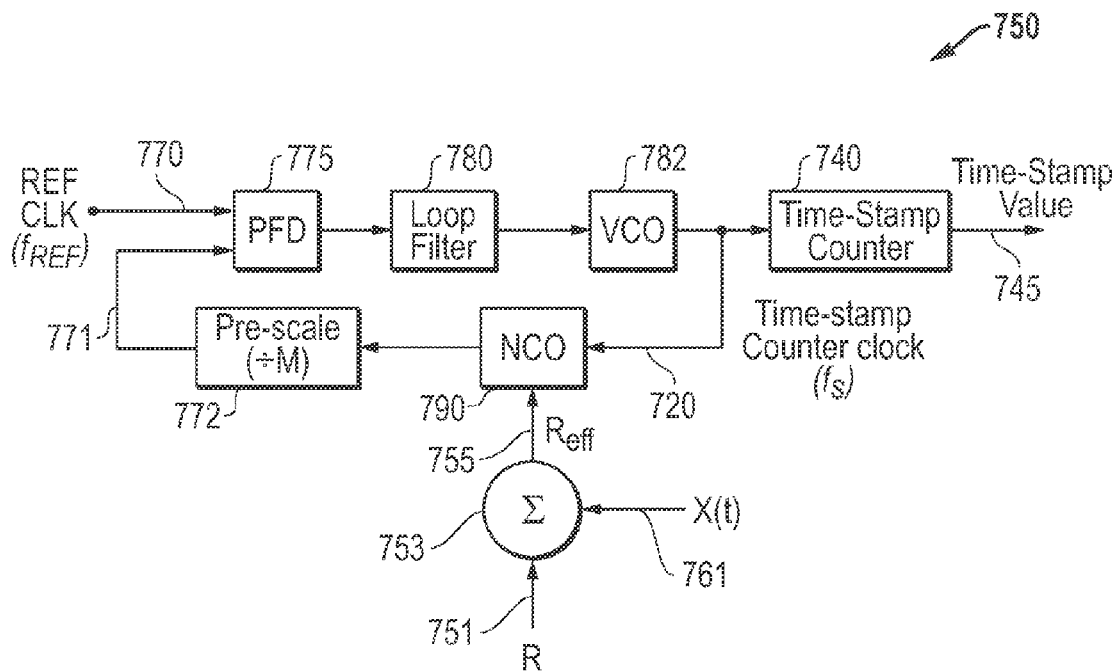
FIG. 7B is a block diagram of an alternate embodiment for using a spread spectrum technique for randomization of time-stamp counter effective values.
Figure 8:
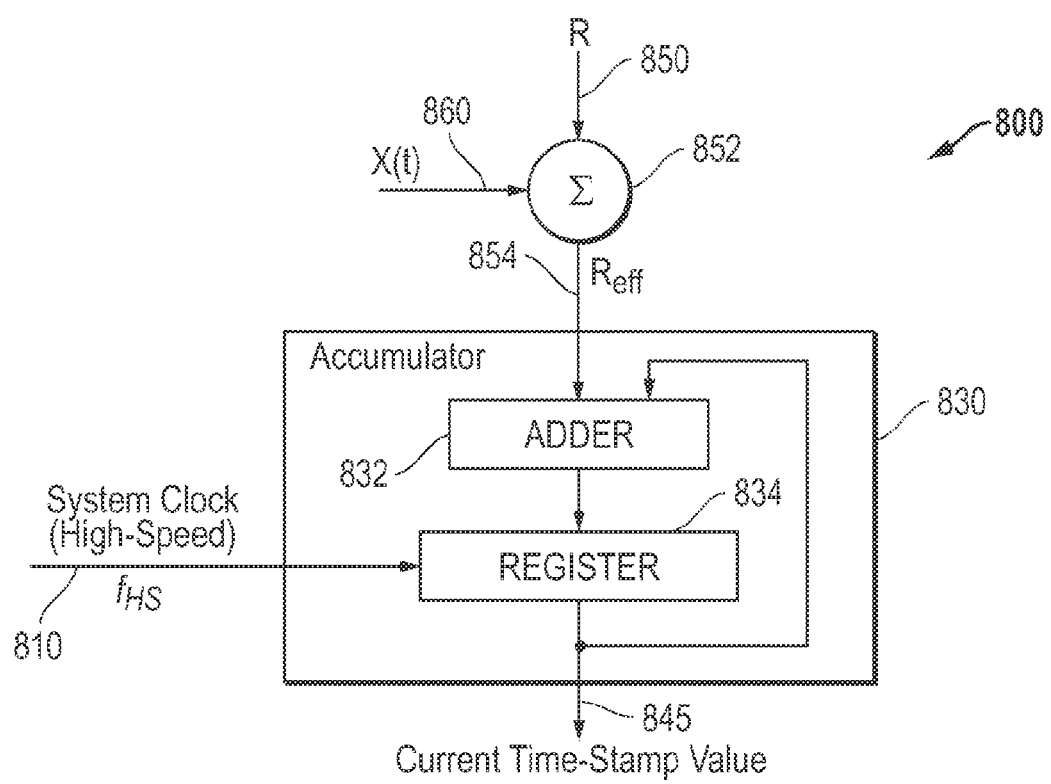
FIG. 8 is a block diagram of an embodiment for using an increment modulation technique for randomization of time-stamp counter effective values.

FIGS. 7A, 7B, and 8 provide additional example embodiments that utilize spread spectrum and/or delta-sigma modulation techniques to effectively randomize the slave time-stamp clock. For these embodiments, a time-stamp generator is configured to generate receive time-stamps associated with the received network packets using a receive time-stamp clock signal having a receive time-stamp clock rate, and an effective rate for the time-stamp clock is varied over time around a mean value to randomize timing for the receive time-stamps with respect to a sender time-stamp clock rate.

For the embodiment 700 of FIG. 7A and for the embodiment 750 for FIG. 7B, the time-stamp clock generator includes a numerically controlled oscillator configured to have a clock signal and a conversion value as inputs and configured to output a signal that is used to provide the receive time-stamp clock signal. The conversion value is further configured to be varied over-time around a mean value to cause the effective rate for the time-stamp clock to vary over time around a mean value.

For the embodiment 800 of FIG. 8, the time-stamp generator includes an adder configured to have a conversion value and a current time-stamp value as inputs and includes a register coupled to receive an output from the adder. The register is further configured to be clocked by the receive time-stamp clock signal to store the output from the adder, and the conversion value is configured to be varied over-time around a mean value to cause the effective rate for the time-stamp clock to vary over time around a mean value. These embodiments will now be described in more detail.

FIG. 7A is a block diagram of an embodiment 700 for using a spread spectrum technique for randomization of time-stamp counter effective values. It is noted that the embodiment 700 is directed to the slave-side time-stamping device for convenience. An equivalent approach can be applied to the master-side time-stamping device.

For the embodiment 700 depicted, the current time-stamp value 745 is obtained as the output of the time-stamp counter 740. The current time-stamp value 745 can be loaded into a time-stamp register (not depicted) as determined by the occurrence of the event being time-stamped as depicted in FIG. 3A (Prior Art). The time-stamp counter 740 is clocked by the time-stamp counter clock ($f_S$) 720. For the embodiment 700 depicted, this time-stamp clock ($f_S$) 720 is generated using a numerically controlled oscillator (NCO) 730 that in turn is driven by a high-speed system clock ($f_{HS}$) 710. The NCO 730 operates to generate the time-stamp counter clock ($f_S$) 720, depending upon the value of a conversion parameter ($R_{eff}$) 754. The relationship of the time-stamp counter clock ($f_S$) 720 to the high-speed system clock ($f_{HS}$) 710 and the conversion parameter ($R_{eff}$) 754 can be represented by the following equation: $f_S = R_{eff} \cdot f_{HS} \cdot G$, where "G" represents an implicit frequency scaling factor of the NCO 730.

The conversion parameter ($R_{eff}$) 754 can be implemented as a time-variable value that varies around a mean or nominal value in order to randomize the time-stamp clock ($f_S$) 720. For the embodiment 700 depicted, the conversion parameter ($R_{eff}$) 754 is generated by adding a variable term X(t) 760 to a nominal value (R) 750 using summer 752. The variable term X(t) 760 can be implemented, for example, as a zero-mean noise sequence. Because the variable term X(t) 760 is zero-mean, on the average, the following equation will be satisfied: $f_S \approx R \cdot f_{HS} \cdot G$. In operation, the significant edges of the time-stamp counter clock ($f_S$) 720 will vary around the nominal (mean) position thereby introducing the desired spread-spectrum behavior.

The additive noise term X(t) 760 can be generated, for example, by using a pseudo-random number generator. The additive noise X(t) 760 can also be constrained such that its maximum absolute value is small, for example, less than about 1% of the nominal value (R) 750, if desired. The additive noise X(t) 760 can also be configured to change slowly relative to the rate of the time-stamp clock ($f_S$) 720. For example, the rate of the time-stamp clock ($f_S$) 720 can be configured to be on the order of 125 MHz, and the rate of change of the variable term X(t) 760 can be configured to be of the order of the packet-transmission rate which is typically of the order of 1 Hz. Other variations could be implemented, as desired.

FIG. 7B is a block diagram of an embodiment 750 which provides an alternate approach to generate the time-stamp counter clock 720 of FIG. 7A. For the embodiment 750, a phase locked loop arrangement is depicted wherein the time-stamp counter clock signal 720 is generated by a voltage controlled oscillator (VCO) 782 and the control input signal for the VCO 782 is generated by filtering the phase difference between a reference clock (REF CLK) 770 and a feedback clock signal 771. The feedback clock signal 771 is generated from the time-stamp counter clock signal 720 with a numerically controlled oscillator (NCO) 790. The NCO 790 has the time-stamp clock signal 720 and a conversion value ($R_{eff}$) 755 as inputs. The conversion value ($R_{eff}$) 755 is further configured to be varied over-time around a mean value to cause the effective rate for the time-stamp clock 720 to vary over time around a mean value.

In operation, the embodiment 750 depicted in FIG. 7B operates similar to embodiment 700 of FIG. 7A except that an alternative method is used to generate the time-stamp counter clock ($f_S$) 720. As depicted, the time-stamp clock ($f_S$) 720 is generated using VCO 782, and VCO 782 is varied according to input control voltage applied to VCO 782. The output of the phase-frequency-detector (PFD) 775 is filtered by loop filter 780, and the output of the loop filter 780 provides the input control voltage to VCO 782. The PFD 775 determines the difference between the reference clock 770 and the feedback signal 771, and outputs a signal indicative of this difference. The feedback signal 771 is based upon the output of NCO 790, as adjusted by the pre-scale block (÷M) 772, which provides a divide-by-M operation. The NCO 790 receives the time-stamp counter clock 720 and the conversion parameter ($R_{eff}$) 755 and provides the feedback signal to the pre-scaling block (÷M) 772. Thus, the NCO 790 is driven by the time-stamp counter clock 720 as modified by the conversion parameter ($R_{eff}$) 755 to produce this feedback output signal. The relationship of the time-stamp counter clock ($f_S$) 720 to the reference clock ($f_{1F}$) 770 and the conversion parameter ($R_{eff}$) 755 can be represented by the following equation: $f_S = R_{eff} \cdot f_{REF} \cdot G \cdot M$, where G represents the implicit frequency scaling factor of the NCO 790, where $f_{REF}$ represents the rate of the reference clock 770, and where M represents the pre-scaling parameter of 772. It is noted that the pre-scale block (÷M) 772 could be removed, if desired.

The conversion parameter ($R_{eff}$) 755 can be implemented as a time-variable value that varies around a mean or nominal value in order to randomize the time-stamp clock ($f_S$) 720. For the embodiment 750 depicted, the conversion parameter ($R_{eff}$) 755 is generated by adding a variable term X(t) 761 to a nominal value (R) 751 using summer 753. The variable term X(t) 761 can be implemented, for example, as a zero-mean noise sequence. Because X(t) 761 is zero-mean, on the average the following equation will be satisfied: $f_S \approx R \cdot f_{REF} \cdot G \cdot M$. In operation, the significant edges of the time-stamp counter clock ($f_S$) 720 will vary around the nominal (mean) position thereby introducing the desired spread-spectrum behavior.

The additive noise term X(t) 761 can be generated, for example, by using a pseudo-random number generator. The additive noise X(t) 761 can also be constrained such that its maximum absolute value is small, for example, less than about 1% of the nominal value (R) 751, if desired. The additive noise X(t) 761 can also be configured to change slowly relative to the rate of the time-stamp clock ($f_S$) 720. For example, the rate of the time-stamp clock ($f_S$) 720 can be configured to be on the order of 125 MHz, and the rate of change of the variable term X(t) 761 can be configured to be of the order of the packet-transmission rate which is typically of the order of 1 Hz. Other variations could be implemented, as desired.

FIG. 8 is an block diagram of an embodiment 800 for using an increment modulation technique for randomization of time-stamp counter effective values. It is noted that the embodiment 800 is directed to the slave-side time-stamping device for convenience. An equivalent approach can be applied to the master-side time-stamping device.

For the embodiment 800 depicted, the current time-stamp value 845 is obtained as the output of an accumulator 830, and the accumulator 830 effectively operates as a time-stamp counter. The current time-stamp value 845 can be loaded into a time-stamp register (not depicted) as determined by the occurrence of the event being time-stamped as depicted in FIG. 3A (Prior Art). For the embodiment 800 depicted, the accumulator 830, which implements the time-stamp counter, is clocked by the high-speed system clock ($f_{HS}$) 810. The accumulator 830 includes an adder 832 that provides an output to a register 834, which is clocked by the high-speed system clock ($f_{HS}$) 810. The output of the register 834 is then provided back to the adder 832, which also receives a conversion parameter ($R_{\it eff}$) 854. This operation of the accumulator 830 emulates a counter driven by a clock of frequency ($f_S$) as represented by the following equation: $f_S = R_{\it eff} \cdot f_{HS}$.

The conversion parameter ($R_{\it eff}$) 754 can be implemented as a time-variable value that varies around a mean or nominal value in order to randomize the value added by adder 832 to the output of register 834 and thereby the emulated time-stamp clock ($f_S$). For the embodiment 800 depicted, the conversion parameter ($R_{\it eff}$) 854 is generated by adding a variable term X(t) 860 to a nominal value (R) 850 using summer 852. The variable term X(t) 860 can be implemented, for example, as a zero-mean noise sequence. Because the variable term X(t) 860 is zero-mean, on the average, the following equation will be satisfied: $f_S \approx R \cdot f_{HS}$. Equivalently, the time increment will correspond to one period of the emulated time-stamp clock ($f_S$). In operation, the increments of the time-stamp counter provided by accumulator 830 will vary around the nominal (mean) value, thereby introducing a desired fractional increment.

The additive noise term X(t) 860 can be generated, for example, by using a pseudo-random number generator. Further the additive noise term X(t) can be constrained, if desired, such that its maximum absolute value is small, for example, less than about 1% of the nominal value (R) 850, if desired. The additive noise X(t) can also be configured to change slowly relative to the rate of the emulated time-stamp clock ($f_S$). For example, the rate of the emulated time-stamp clock ($f_S$) can be configured to be of the order of 125 MHz, and the rate of change of X(t) can be configured to be of the order of the packet-transmission rate which is typically of the order of 1 Hz. Other variations could be implemented, as desired.

It is noted that the variable increment term X(t) 860 is effectively the equivalent of a fraction. Thus, if the nominal value (R) 850 is considered to be an integer, then the effective value ($R_{\it eff}$) 854 output by the summer 852 will be a fractional value between R and (R+1) on the average. Assuming this fractional value is represented by "η," the effective value ($R_{EFF}$) 854 can be viewed as a sequence that will take on values 0 and 1 such that over a period of time the average value is η. This result can be achieved, if desired, using a delta-sigma-modulator to convert the fraction η into a pulse-density-modulated stream. This pulse-density-modulate stream can then be applied as the variable term X(t) 860.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

The invention claimed is:

1. A receiving device for network communications, comprising:
    a packet reception interface configured to receive network packets from a sending device;
    a time-stamp generator configured to generate receive time-stamps associated with received network packets using a receive time-stamp clock signal having a receive time-stamp clock rate; and
    a time-stamp clock generator configured to generate the receive time-stamp clock signal having the receive time-stamp clock rate, the receive time-stamp clock rate being configured to be intentionally different from a sender time-stamp clock rate for a sender time-stamp clock signal used to generate sender time-stamps such that the receive time-stamp clock rate is not syntonized with the sender time-stamp clock rate, and the receive time-stamp clock signal not being synchronized with the sender time-stamp clock signal and differing in phase from the sender time-stamp clock signal from clock-cycle to clock-cycle, such that systematic time-stamp granularity errors are not introduced;
    wherein the receive time-stamp clock rate and the sender time-stamp clock rate comprise a slave time-stamp clock rate and a master time-stamp clock rate; and
    wherein the ratio ($f_{S1}f_M$) of the slave time-stamp clock rate ($f_S$) to the master time-stamp clock rate ($f_M$) has a fixed non-integer relationship and are related by a ratio R/T where R and T are integers and T is greater than 1000 after common factors are removed.

2. The receiving device of claim 1, wherein the receive time-stamp clock rate has a fixed relationship to the sender time-stamp clock rate such that their ratio is a rational number.

3. The receiving device of claim 1, wherein the receive time-stamp clock rate varies over time and has an average value equal to a rational multiple of an average sender time-stamp clock rate.

4. The receiving device of claim 1, wherein the receive time-stamp clock rate is randomized using a spread spectrum technique.

5. The receiving device of claim 1, wherein the receive time-stamp clock rate is randomized using a sigma-delta modulation technique.

6. The receiving device of claim 1, wherein the time-stamp clock generator is further configured to generate a second receive time-stamp clock signal that is syntonized with the sender time-stamp clock signal, and wherein the time-stamp generator is further configured to generate a second time-stamp using the second time-stamp clock signal.

7. The receiving device of claim 1, wherein the sender time-stamp clock rate is configured to match a media independent interface clock rate for Ethernet communications.

8. The receiving device of claim 1, wherein the time-stamp generator is further configured to generate time-stamps for network packets to be transmitted to the sending device.

9. A system for network communications, comprising:
a sending device, comprising:
  a time-stamp generator configured to use a sender time-stamp clock signal having a sender time-stamp clock rate to generate sender time-stamps, the sender time-stamps being associated with transmitted network packets;
  a time-stamp clock generator configured to generate the sender time-stamp clock signal having the sender time-stamp clock rate; and
  a packet transmission interface configured to transmit network packets;
a receiving device, comprising:
  a packet reception interface configured to receive network packets from the sending device;
  a time-stamp generator configured to generate receive time-stamps associated with received network packets using a receive time-stamp clock signal having a receive time-stamp clock rate; and
  a time-stamp clock generator configured to generate the receive time-stamp clock signal having the receive time-stamp clock rate, the receive time-stamp clock rate being configured to intentionally different from the sender time-stamp clock rate such that the receive time-stamp clock rate is not syntonized with the sender time-stamp clock rate, and the receive time-stamp clock signal not being synchronized with the sender time-stamp clock signal and differing in phase from the sender time-stamp clock signal from clock-cycle to clock-cycle, such that systematic time-stamp granularity errors are not introduced;
  wherein the receive time-stamp clock rate and the sender time-stamp clock rate comprise a slave time-stamp clock rate and a master time-stamp clock rate; and
  wherein the ratio ($f_{S1}f_M$) of the slave time-stamp clock rate ($f_S$) to the master time-stamp clock rate ($f_M$) has a fixed non-integer relationship and are related by a ratio R/T where R and T are integers and T is greater than 1000 after common factors are removed.

10. The system of claim 9, wherein the receive time-stamp clock rate has a fixed relationship to the sender time-stamp clock rate such that their ratio is a rational number.

11. The system of claim 9, wherein the receive time-stamp clock rate varies over time and has an average value equal to a rational multiple of an average sender time-stamp clock rate.

12. The system of claim 9, wherein the receive time-stamp clock rate is randomized using a spread spectrum technique.

13. The system of claim 9, wherein the receive time-stamp clock rate is randomized using a sigma-delta modulation technique.

14. The system of claim 9, wherein the time-stamp clock generator for the receiving device is further configured to generate a second receive time-stamp clock signal that is syntonized with the sender time-stamp clock signal, and wherein the time-stamp generator for the receiving device is further configured to generate a second receive time-stamp using the second receive time-stamp clock signal.

15. A method for network communications, comprising:
receiving at a receiving device network packets from a sending device, the network packets including sender time-stamps generated at the sending device using a sender time-stamp clock signal having a sender time-stamp clock rate;
generating a receive time-stamp clock signal having a receive time-stamp clock rate intentionally different from the sender time-stamp clock rate such that the receive time-stamp clock rate is not syntonized with the sender time-stamp clock rate, and the receive time-stamp clock signal not being synchronized with the sender time-stamp clock signal and differing in phase from the sender time-stamp clock signal from clock-cycle to clock-cycle, such that systematic time-stamp granularity errors are not introduced;
generating receive time-stamps associated with received network packets using the receive time-stamp clock signal; and
utilizing the sender time-stamps and the receive time-stamps for time alignment within the receiving device;
wherein the receive time-stamp clock rate and the sender time-stamp clock rate comprise a slave time-stamp clock rate and a master time-stamp clock rate; and
wherein the ratio ($f_{S1}f_M$) of the slave time-stamp clock rate ($f_S$) to the master time-stamp clock rate ($f_M$) has a fixed non-integer relationship and are related by a ratio R/T where R and T are integers and T is greater than 1000 after common factors are removed.

16. The method of claim 15, further comprising generating the receive time-stamp clock signal so that the receive time-stamp clock rate has a fixed relationship to the sender time-stamp clock rate such that their ratio is a rational number.

17. The method of claim 15, further comprising varying the receive time-stamp clock rate over time to have an average value equal to a rational multiple of an average sender time-stamp clock rate.

18. The method of claim 15, further comprising randomizing the receive time-stamp clock rate using a spread spectrum technique.

19. The method of claim 15, further comprising randomizing the receive time-stamp clock rate using a sigma-delta modulation technique.

20. The method of claim 15, further comprising generating a second receive time-stamp clock signal that is syntonized with the sender time-stamp clock signal, using the second time-stamp clock signal to generate second receive time-stamps for the received network packets, and also utilizing the second receive time-stamps for time alignment in the receiving device.

21. The method of claim 15, further comprising generating receive time-stamps for network packets to be transmitted to the sending device, and transmitting the network packets with the receive time-stamps to the sending device.

22. The method of claim 15, further comprising:
generating at the sending device a sender time-stamp clock signal having the sender clock rate;
generating sender time-stamps using the sender time-stamp clock signal, the sender time-stamps being associated with network packets to be transmitted to the receiving device; and
transmitting the network packets with the sender time-stamps to the receiving device.

* * * * *